United States Patent [19]

Hatakeyama et al.

[11] Patent Number: 5,541,037

[45] Date of Patent: Jul. 30, 1996

[54] ANTI-REFLECTIVE MATERIAL AND PATTERNING METHOD

[75] Inventors: Jun Hatakeyama; Mitsuo Umemura; Hirohumi Kishita, all of Usui-gun, Japan

[73] Assignee: Shin-Etsu Chemical Co., Ltd., Tokyo, Japan

[21] Appl. No.: 360,045

[22] Filed: Dec. 20, 1994

[30] Foreign Application Priority Data

Dec. 21, 1993 [JP] Japan .................................. 5-345213

[51] Int. Cl.$^6$ .................................................. G03C 1/825
[52] U.S. Cl. ............................ 430/273.1; 430/270.1; 430/325; 562/579; 562/542; 562/583; 562/586
[58] Field of Search ............................ 562/579, 586, 562/582, 583; 430/273.1, 631, 634, 637, 327, 328, 270.1, 325; 428/694 DE

[56] References Cited

U.S. PATENT DOCUMENTS 4,085,137  4/1978  Mitsch et al. ............................ 562/583
4,845,268  7/1989  Ohsaka et al. ........................... 562/583

*Primary Examiner*—Thorl Chea
*Attorney, Agent, or Firm*—Millen, White, Zelano, & Branigan, P.C.

[57] ABSTRACT

The invention provides an anti-reflective material comprising a salt of a carboxyl-terminated fluorinated alkyl polyether compound with a water-soluble amino compound. A resist pattern is defined by forming anti-reflective layer of the anti-reflective material on a photoresist layer, exposing the photoresist layer to a desired pattern of light, removing the anti-reflective layer, and developing the photoresist layer. A fine resist pattern having improved dimensional and alignment accuracies can be defined in a simple, efficient, reproducible manner without substantial environmental pollution. The invention is advantageously utilized in photolithography using photoresists.

21 Claims, 3 Drawing Sheets

ANTI-REFLECTIVE MATERIAL AND PATTERNING METHOD

BACKGROUND OF THE INVENTION

1. Field of the Invention

This invention relates to an anti-reflective material for use in photo-lithography in combination with a photoresist for enabling fine processing with high accuracy on irregular substrates and a method for forming a resist pattern using the anti-reflective material.

2. Prior Art

Increased integration and density of modern semiconductor integrated circuits requires increasing the accuracy of pattern dimensions in patterning processes. Fine patterns are generally formed by exposing a photoresist to light in a desired pattern followed by development to produce a resist image, which is known as photo-lithography.

However, if a substrate has an irregular surface, the photoresist layer changes its thickness at steps to induce optical interference. As a result, the resist image becomes low in dimensional accuracy, failing to process a pattern to an accurate size. Also the dimensional accuracy of alignment marks for successive exposure is reduced, leading to a low alignment accuracy.

Several patterning techniques were proposed as having solved the above-mentioned problems associated with substrate surface irregularities, for example, a multi-layer resist technique as disclosed in Japanese Patent Application Kokai (JP-A) No. 10775/1976, an ARC technique (anti-reflective coating beneath resist) as disclosed in JP-A 93448/1984, and an ARCOR technique (anti-reflective coating on resist) as disclosed in JP-A 62520/1987. The multi-layer technique involves forming two or three layers of resist and transferring a pattern to form a resist pattern serving as a mask. Undesirably the multi-layer technique requires a number of steps and is low in production efficiency. Light reflection from an intermediate layer can cause a lowering of dimensional accuracy. The ARC technique is performed by etching an anti-reflective film formed beneath the resist layer. The dimensional accuracy is substantially lost by etching and the extra etching step lowers production efficiency.

In contrast, the ARCOR technique which involves forming a transparent anti-reflective film on a resist layer and peeling the film after exposure is able to form a fine resist pattern to high dimensional and alignment accuracy in a convenient way. By using low index of refraction material, for example, perfluoroalkyl compounds (e.g., perfluoroalkyl polyethers and perfluoroalkylamines) as the anti-reflective film, the ARCOR technique minimizes reflection light at the resist layer/anti-reflective film interface, thereby improving the dimensional accuracy of a resist image.

However, since the perfluoroalkyl compounds have low compatibility with organic materials, they must be diluted with such diluents as Freon solvents in order to control the thickness of a coating film. The use of Freon is now undesirable from the standpoint of environmental protection. In addition, the perfluoroalkyl compounds form less uniform films whose performance is less satisfactory as an anti-reflective film. Since the anti-reflective film of perfluoroalkyl compound must be peeled off with Freon prior to development of the photoresist, an extra means for peeling the anti-reflective film must be added to the existing system. These combined with the cost of Freon solvent are the demerits of the ARCOR technique from a practical aspect.

SUMMARY OF THE INVENTION

Therefore, an object of the present invention is to provide an anti-reflective material which permits simple formation of a fine resist pattern at high dimensional and alignment accuracies, in high production efficiency, in a reproducible manner, without an environmental problem. Another object is to provide a resist pattern forming method using the same.

We have found that a salt of a fluorinated alkyl polyether compound with a water-soluble amino compound, when used as the anti-reflective material, minimizes reflection light at the resist layer surface without a loss of incident light, prevents any lowering of a pattern's dimensional accuracy by optical multiple interference in the resist layer, eliminates a need for Freon solvent, and allows for easy removal. The salts which can be used herein are those of the following general formulae (1) to (4):

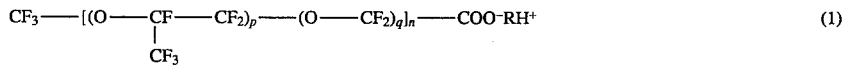

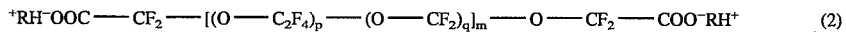

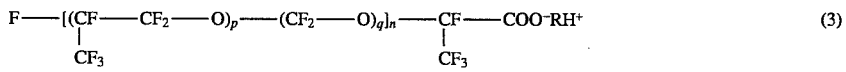

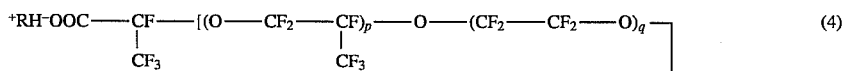

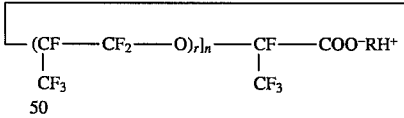

wherein R is a water-soluble amino compound, letters p, q, and r are integers of 0 to 10, and m and n are integers of 1 to 10.

More particularly, the salts of a fluorinated alkyl polyether compound with a water-soluble amino compound of formulae (1) to (4) have a high content of fluorine and a low index of refraction (about 1.3). When an anti-reflective layer is formed on a resist layer from a material comprising the salt, optical reflectance can be significantly decreased and the dimensional accuracy of a resist image is increased. If a material having an index of refraction of about 1.3 is difficult to coat or forms less uniform coatings, then no anti-reflection effect is available over the entire substrate surface. In contrast, a material comprising at least one of the salts of formulae (1) to (4) can be coated to high uniformity without troubles like cissing and thickness variations. When the material is coated on a resist layer to form an anti-reflective layer, stable anti-reflection effect is available over the entire substrate surface. Unlike the perfluoroalkyl compounds proposed as the anti-reflective film-forming material in JP-A 625620/1987, this material is soluble in aqueous alkali solution because of the presence of a hydroxycarbonyl group at a molecular end and can be converted into a water-soluble salt by mixing with a water-soluble amino compound. Then water can be used as diluent or rinse solution. Therefore the anti-reflective layer can be readily removed by means of a conventional development unit without the risk of environmental development unit without the risk of environmental pollution and without a need for an extra peeling means.

In order that the anti-reflective film be removed without a need for an extra peeling means, the anti-reflective material is desired to be readily removed or peeled off with solutions commonly used in the positive photoresist development unit (alkaline aqueous solution as the developer and pure water as the rinse liquid). That is, a water-or alkali-soluble material is desired. Since the salts of formulae (1) to (4) meet this requirement, the salts are practically very useful in that installation of an extra peeling unit is unnecessary, the investment for such installation is saved, and productivity is improved as well as production yields.

According to the present invention, there is provided an anti-reflective material comprising at least one salt of a fluorinated alkyl polyether compound-with a water-soluble amino compound, having the general formula (1), (2), (3) or (4).

The present invention also provides a method for forming a resist pattern, comprising the steps of forming an anti-reflective layer from the above-defined material on a photoresist layer, illuminating the photoresist layer through the anti-reflective layer, and thereafter removing the anti-reflective layer.

DETAILED DESCRIPTION OF THE INVENTION

Figure 1A:
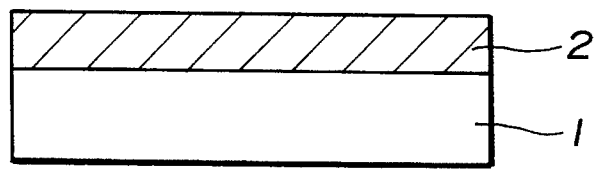
FIG. 1 illustrates a typical lithographic process.

The optical anti-reflective material according to the present invention is defined as comprising at least one salt of a fluorinated alkyl polyether compound with a water-soluble amino compound. The salt is selected from those having the general formulae (1), (2), (3) and (4).

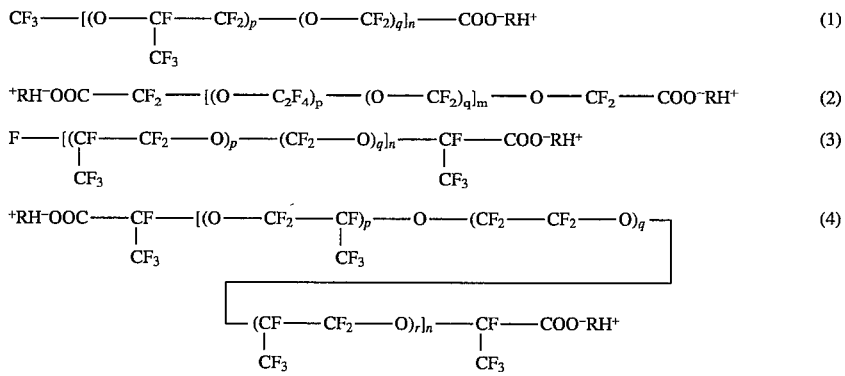

In the formulae, R is a water-soluble amino compound, letters p, q, and r are integers of 0 to 10, preferably 0 to 7, and m and n are integers of 1 to 10, preferably 1 to 5.

Examples of the water-soluble amino compound include tris(hydroxymethyl)aminomethane, pyridine, trimethylamine, triethylamine, tetramethylammonium hydroxide solution, tetraethylammonium hydroxide solution, tetrapropylammonium hydroxide solution, tetrabutylammonium hydroxide solution, chroline solution, 2,2'2"-nitrotriethanol, 1,4-diazabicyclo[2.2.2]octane (DABCO), 1,5-diazabicyclo[4.3.0]nonene-5 (DBN), 1,8-diazabicyclo[5.4.0]undecene-7 (DBU), 1-deoxy-1 -(2-hydroxyethylamino)-D-glucitol, and 1-deoxy- 1-(methylamino)-D-galactitol.

The water-soluble amino compound is preferably added in an amount of 0.1 to 5 mol, especially 0.5 to 1.5 mol per mol of the carboxyl-terminated fluorinated alkyl polyether compound of formula (1) to (4). Less than 0.1 mol of the water-soluble amino compound would be insufficient to hydrate the fluorinated alkyl polyether compound. More than 5 mol of the water-soluble amino compound would render the material too strongly alkaline so that the material could mix with the photoresist after exposure for rendering the photoresist surface difficultly soluble.

In addition to the salt of a fluorinated alkyl polyether compound with a water-soluble amino compound, the anti-reflective material may further include surfactants, water-soluble polymers and other additives. Exemplary surfactants are betaine-type surfactants, amine oxide surfactants, amine carboxylate surfactants, polyoxyethylene alkyl ether surfactants, and fluorinated ones of these surfactants. The surfactant is preferably added in an amount of 0.0001 to 10 parts, especially 0.001 to 1 part by weight per 100 parts by weight of the fluorinated alkyl polyether compound salt of formula (1) to (4).

Water-soluble polymers are added for improving film forming ability. Exemplary water-soluble polymers are polyvinyl alcohol, polyacrylic acid, polymethacrylic acid, polyvinyl pyrrolidone, polyethylene oxide, amylose, dextran, cellulose, and pluran. The water-soluble polymer is preferably added in an amount of 3 to 300 parts, especially 30 to 100 parts by weight per 100 parts by weight of the fluorinated alkyl polyether compound salt. Less than 3 parts by weight of the water-soluble polymer would be ineffective for further improving anti-reflection effect whereas more than 300 parts by weight of the water-soluble polymer would rather detract from film forming ability.

Figure 1B:
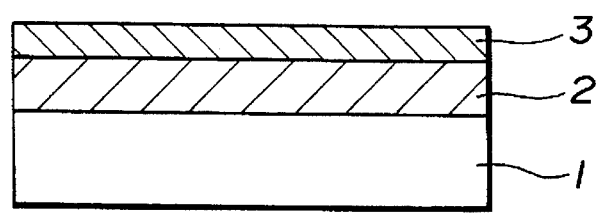
Figure 1C:
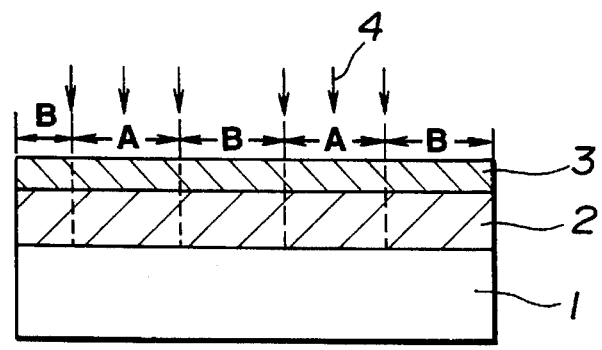
Figure 1D:
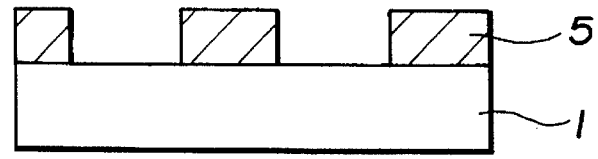

Any desired well-known technique may be used in forming a resist pattern using the anti-reflective material according to the present invention. For example, a typical lithographic process is shown in FIG. 1. First a photoresist layer 2 is formed on a substrate 1 such as a silicon wafer by a suitable technique such as spin coating as shown in FIG. 1(a). The anti-reflective material according to the invention is applied onto the photoresist layer 2 as by spin coating, forming an anti-reflective layer 3 as shown in FIG. 1(b). The anti-reflective layer 3 is exposed to a desired pattern of ultraviolet radiation 4 having a wavelength of 200 to 500 nm by a demagnification projection technique. That is, regions A of the anti-reflective layer 3 and photoresist layer 2 are illuminated as shown in FIG. 1(c). Thereafter, the anti-reflective layer 3 is removed. The photoresist layer 2 is developed with a conventional developer, obtaining a resist pattern 5 as shown in FIG. 1(d).

The diluent used for coating the anti-reflective material can be pure water. For removal of the anti-reflective layer, a conventional development unit for positive photoresists may be utilized. The anti-reflective layer can be readily removed by rinsing with pure water.

Figure 2:
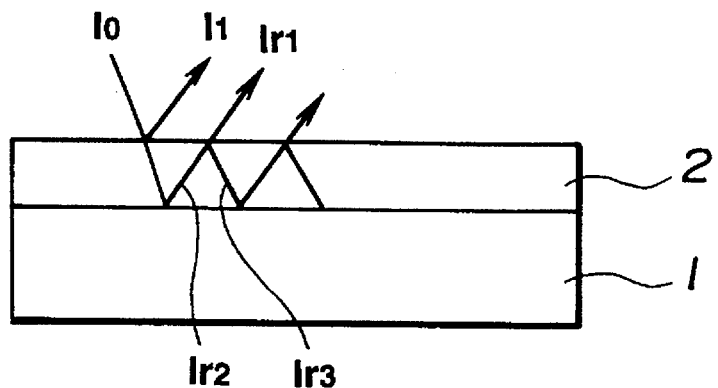
FIG. 2 shows light scattering associated with a resist layer formed on a substrate.
Figure 3:
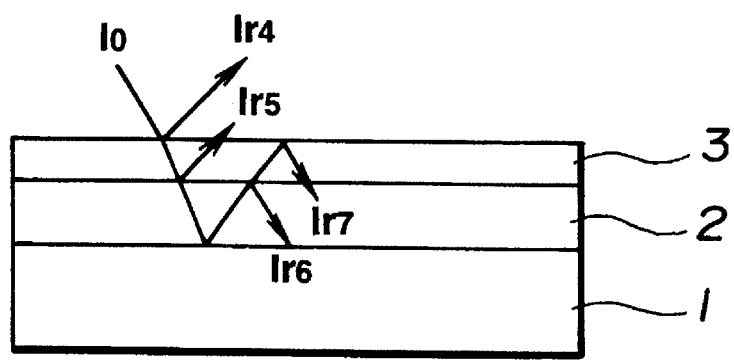
FIG. 3 shows light scattering associated with an anti-reflective film and a resist layer on a substrate.

Referring to FIGS. 2 and 3, it is described how the anti-reflective film according to the invention reduces optical scattering. FIG. 2 shows a prior art structure in which only a resist layer 2 is formed on a substrate 1. Incident light $I_0$ reaching the resist layer 2 undergoes substantial reflection $I_1$ at the air-resist layer interface with a substantial portion of the incident light quantity being lost. The light entering the resist layer 2 undergoes reflection $I_{r2}$ at the resist layer-substrate interface whereupon the reflected light $I_{r2}$ goes out of the resist layer 2 as emergetn light $I_{r1}$ while it is reflected $I_{r3}$ again at the resist layer-air interface. This process is repeated in the resist layer. That is, optical multiple interference occurs in the resist layer 2.

FIG. 3 shows a structure in which an anti-reflective film 3 according to the invention is formed on a resist layer 2 on a substrate 1. The provision of the anti-reflective film 3 is effective for reducing reflection $I_{r4}$ of incident light $I_0$ at the air-anti-reflective film interface and reflection $I_{r5}$ at the anti-reflective film-resist layer interface. Since $I_{r6}$ and $I_{r5}$ are reduced, the loss of incident light quantity is reduced. Since reflection $I_{r6}$ of the reflected light at the resist layer-anti-reflective film interface and reflection $I_{r7}$ of the reflected light at the anti-reflective film-air interface are opposite in phase, they offset each other, suppressing optical multiple interference in the resist layer 2.

According to the principle of reflection prevention, provided that the resist has an index of refraction n to illuminating light and the illuminating light has a wavelength $\lambda$, the reflectivity (amplitude ratio) of an anti-reflective film is reduced as the index of refraction n' of the anti-reflective film approaches to $\sqrt{n}$ and the thickness thereof approaches to an odd multiple of $\lambda/4n'$. For example, a phenol-novolak material used as the resist material has an index of refraction of about 1.7. The compounds of formulae (1) to (4) have an index of refraction of about 1.3. The light used is i-ray having a wavelength of 365 nm. Then the optimum thickness of the anti-reflective film is an odd multiple of about 700 Å. Under these conditions, the use of any of the compounds of formulae (1) to (4) is effective for reducing the reflected light and suppressing the optical multiple interference.

There have been described an optical anti-reflective material and a resist pattern forming method by which a fine resist pattern having improved dimensional and alignment accuracies can be defined in a simple, efficient, reproducible manner without substantial environmental pollution. The invention is thus very useful in commercial practice. The invention is advantageously utilized in photo-lithography using photoresists, especially high-precision fine patterning on a substrate having an irregular surface.

EXAMPLE

Examples of the present invention are given below by way of illustration and not by way of limitation.

Example 1

Sample 1 was prepared by mixing 5.54 g of a fluorinated alkyl polyether compound of the following formula (5), 1.47 g of tetraethylammonium hydroxide, 3 g of pluran having an average molecular weight of $20\times10^4$ and 100 g of pure water.

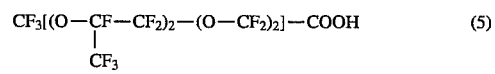

$$CF_3[(O-CF-CF_2)_2-(O-CF_2)_2]-COOH \quad\quad (5)$$
$$\quad\quad\quad |$$
$$\quad\quad\quad CF_3$$

Sample 1 was dispensed on a 6-inch wafer which was rotated first at 300 rpm for 3 seconds and then at 5,000 rpm for 20 seconds to form an anti-reflective film. The film was measured for thickness and index of refraction by ellipsometry.

Using a photoresist THMRip1800 (manufactured by Tokyo Oka-Kogyo K.K., pre-baked at a temperature of 80° C. for 90 seconds), a photoresist film was formed on a 6-inch wafer to varying thickness. Sample 1 was dispensed on the photoresist-coated wafer which was rotated first at 300 rpm for 3 seconds and then at 4,000 rpm for 20 seconds to form an anti-reflective film.

Using an i-ray stepper, stepping exposure was made while the exposure of one shot over 4 mm square area was varied. The anti-reflective film was removed by rinsing with pure water. The photoresist film was post-exposure baked at a temperature of 110° C. for 90 seconds, subjected to static paddle development with a developer NMD-W (manufactured by Tokyo Oka-Kogyo K.K.) at a temperature of 23° C. for 65 seconds, and then rinsed with pure water.

Optical interference within the photoresist film was determined from a variation of Eth relative to the thickness variation of the photoresist film, provided that Eth is the exposure dose at which the photoresist film was completely eliminated.

Example 2

Sample 2 was prepared by mixing 5.70 g of a fluorinated alkyl polyether compound of the following formula (6), 1.47 g of tetraethylammonium hydroxide, 3 g of pluran having an average molecular weight of $20\times10^4$ and 100 g of pure water.

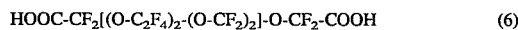

$$HOOC-CF_2[(O-C_2F_4)_2-(O-CF_2)_2]-O-CF_2-COOH \quad\quad (6)$$

Sample 2 was dispensed on a 6-inch wafer which was rotated first at 300 rpm for 3 seconds and then at 5,000 rpm for 20 seconds to form an anti-reflective film. The film was measured for thickness and index of refraction by ellipsometry.

Using a photoresist THMRip1800 (manufactured by Tokyo Oka-Kogyo K.K., pre-baked at a temperature of 90° C. for 90 seconds), a photoresist film was formed on a 6-inch wafer to varying thickness. Sample 2 was dispensed on the photoresist-coated wafer which was rotated first at 300 rpm for 3 seconds and then at 4,000 rpm for 20 seconds to form an anti-reflective film.

Using an i-ray stepper, stepping exposure was made while the exposure of one shot over 4 mm square area was varied. The anti-reflective film was removed by rinsing with pure water. The photoresist film was post-exposure baked at a temperature of 110° C. for 90 seconds, subjected to static paddle development with a developer NMD-W (manufactured by Tokyo Oka-Kogyo K.K.) at a temperature of 23° C. for 65 seconds, and then rinsed with pure water.

Optical interference within the photo-resist film was determined from a variation of Eth relative to the thickness variation of the photoresist film, provided that Eth is the exposure at which the photoresist film was completely eliminated.

Example 3

Sample 3 was prepared by mixing 4.96 g of a fluorinated alkyl polyether compound of the following formula (7), 1.47 g of tetraethylammonium hydroxide, 3 g of pluran having an average molecular weight of $20 \times 10^4$ and 100 g of pure water.

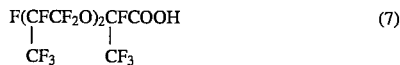

(7)

Sample 3 was dispensed on a 6-inch wafer which was rotated first at 300 rpm for 3 seconds and then at 4,000 rpm for 20 seconds to form an anti-reflective film. The film was measured for thickness and index of refraction by ellipsometry.

Using a photoresist THMRip1800 (manufactured by Tokyo Oka-Kogyo K.K., pre-baked at a temperature of 90° C. for 90 seconds), a photoresist film was formed on a 6-inch wafer to varying thickness. Sample 3 was dispensed on the photoresist-coated wafer which was rotated first at 300 rpm for 3 seconds and then at 4,000 rpm for 20 seconds to form an anti-reflective film.

Using an i-ray stepper, stepping exposure was made while the exposure of one shot over 4 mm square area was varied. The anti-reflective film was removed by rinsing with pure water. The photoresist film was post-exposure baked at a temperature of 110° C. for 90 seconds, subjected to static paddle development with a developer NMD-W (manufactured by Tokyo Oka-Kogyo K.K.) at a temperature of 23° C. for 65 seconds, and then rinsed with pure water.

Optical interference within the photo-resist film was determined from a variation of Eth relative to the thickness variation of the photoresist film, provided that Eth is the exposure at which the photoresist film was completely eliminated.

Example 4

Sample 4 was prepared as in Example 1 except that 3.30 g of a fluorinated alkyl polyether compound of the following formula (8) was used.

(8)

As in Example 1, an anti-reflective film was formed from Sample 4 and measured for thickness and index of refraction. Optical interference within the photoresist film was also determined as in Example 1.

Example 5

Sample 5 was prepared as in Example 1 except that 2.45 g of a fluorinated alkyl polyether compound of the following formula (9) was used.

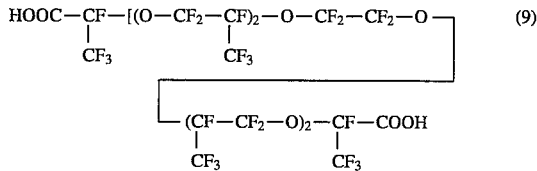

As in Example 1, an anti-reflective film was formed from Sample 5 and measured for thickness and index of refraction. Optical interference within the photoresist film was also determined as in Example 1.

Comparative Example 1

Using a photoresist THMRip1800 (manufactured by Tokyo Oka-Kogyo K.K., pre-baked at a temperature of 90° C. for 90 seconds), a photoresist film was formed on a 6-inch wafer to varying thickness. Using an i-ray stepper, stepping exposure was made while the exposure of one shot over 4 mm square area was varied. The photoresist film was post-exposure baked at a temperature of 110° C. for 90 seconds, subjected to static paddle development with a developer NMD-W (manufactured by Tokyo Oka-Kogyo K.K.) at a temperature of 23° C. for 65 seconds, and then rinsed with pure water.

Optical interference within the photo-resist film was determined from a variation of Eth relative to the thickness variation of the photoresist film, provided that Eth is the exposure at which the photoresist film was completely eliminated.

Figure 4:
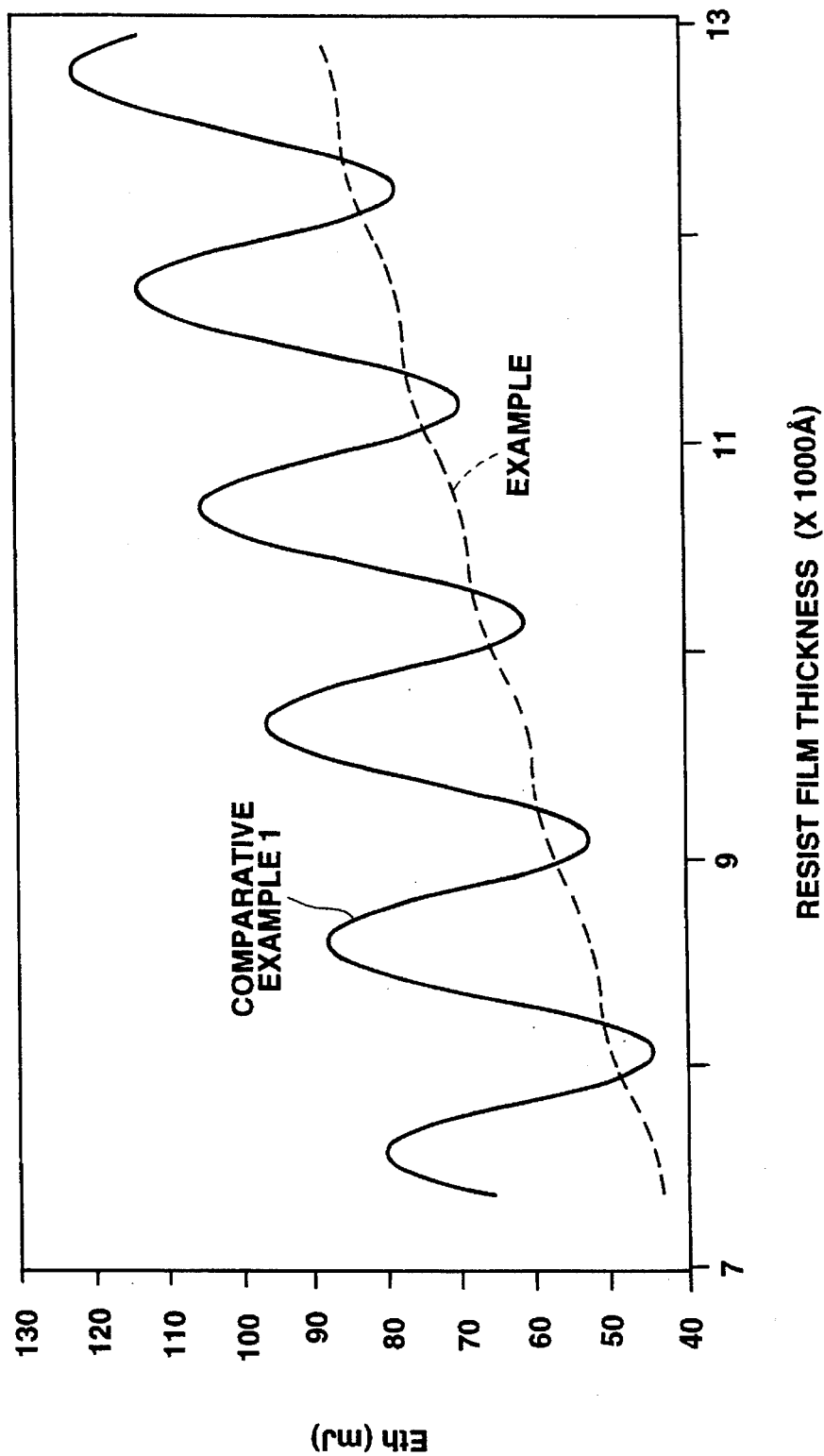
FIG. 4 is a graph showing a variation of Eth relative to the thickness variation of a photoresist film for Examples 1–3 and Comparative Example 1.

Table 1 reports the thickness and index of refraction of anti-reflective films of Examples 1 to 5. FIG. 4 is a graph showing a variation of Eth relative to the thickness variation of a photoresist film for Examples 1 to 3 and Comparative Example 1.

TABLE 1

| | Anti-reflective film | |
|---|---|---|
| | Thickness (Å) | Index of refraction |
| Example 1 | 720 | 1.36 |
| Example 2 | 720 | 1.36 |
| Example 3 | 700 | 1.37 |
| Example 4 | 706 | 1.38 |
| Example 5 | 703 | 1.37 |

It is evident from Table 1 and FIG. 4 that when an anti-reflective layer is formed on a photoresist film using the anti-reflective material of the invention, a fine resist pattern having improved dimensional and alignment accuracies can be defined in a simple manner.

Japanese Patent Application No. 5-345213 is incorporated herein by reference.

Although some preferred embodiment have been described, many modifications and variations may be made thereto in the light of the above teachings. It is therefore to be understood that within the scope of the appended claims, the invention may be practiced otherwise than as specifically described.

We claim:

1. A salt of a fluorinated alkyl polyether compound with a water-soluble amino compound, wherein said salt is of formulae (1), (2), (3) or (4):

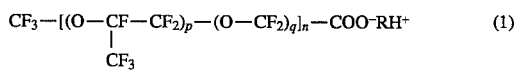

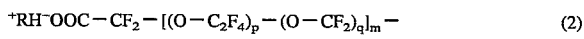

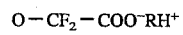

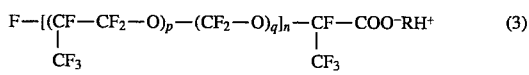

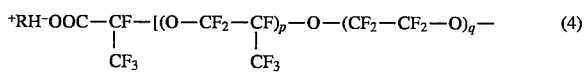

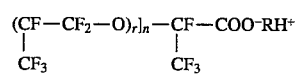

wherein

R is a water-soluble amino compound, p, q and r are each independently an integer of 0 to 10, and m and n are each independently an integer of 1 to 10.

2. A salt according to claim 1, wherein p, q and r are each independently integers of 0 to 7.

3. A salt according to claim 1, wherein m and n are each independently integers of 1 to 5.

4. A salt according to claim 1, wherein R is tris(hydroxymethyl)aminomethane, pyridine, trimethylamine, triethylamine, tetramethylammonium hydroxide, tetraethylammonium hydroxide, tetrapropylammonium hydroxide, tetrabutylammonium hydroxide, chroline, 2,2'2"-nitrotriethanol, 1,4-diazabicyclo[2.2.2]octane, 1,5-diazabicyclo[4.3.0]nonene-5, 1,8-diazabicyclo [5.4.0]undecene-7, 1-deoxy-1-(2-hydroxyethylamino)-D-glucitol or 1-deoxy-1-(methylamino)-D-galactitol.

5. A salt according to claim 1, wherein said salt is of formula (1).

6. A salt according to claim 1, wherein said salt is of formula (2).

7. A salt according to claim 1, wherein said salt is of formula (3).

8. A salt according to claim 1, wherein said salt is of formula (4).

9. An anti-reflective composition comprising:

at least one salt of claim 1 and 0.0001 to 10 parts by weight of a surfactant per 100 parts by weight of said salt.

10. A composition according to claim 9, wherein said surfactant is a betaine surfactant, an amine oxide surfactant, an amine carboxylate surfactant or a polyoxyethylene alkyl ether surfactant, in each case being fluorinated or unfluorinated.

11. A composition according to claim 9, wherein said composition contains 0.001 to 1 part by weight of said surfactant per 100 parts by weight of said salt.

12. A composition according to claim 9, wherein said composition further comprises 3–300 parts by weight of a watersoluble polymer per 100 parts by weight of said salt.

13. An anti-reflective composition comprising:

at least one salt of claim 1, and 3 to 300 parts by weight of a water-soluble polymer per 100 parts by weight of said salt.

14. A composition according to claim 13, wherein said watersoluble polymer is a polyvinyl alcohol, a polyacrylic acid, a polymethacrylic acid, a polyvinyl pyrrolidone, a polyethylene oxide, amylose, dextran, cellulose or pluran.

15. A composition according to claim 13, wherein said composition contains 30–100 parts by weight of said water-soluble polymer per 100 parts by weight of said salt.

16. A method for forming a resist pattern, comprising:

forming a layer of anti-reflective material, containing at least one salt of claim 1, on a photoresist layer, illuminating said photoresist layer through said layer of anti-reflective material, and thereafter removing said layer of anti-reflective material.

17. A method according to claim 16, wherein said layer of anti-reflective material further contains a surfactant.

18. A method according to claim 16, wherein said layer of anti-reflective material further contains a water-soluble polymer.

19. A method according to claim 17, wherein said layer of anti-reflective material further contains a water-soluble polymer.

20. A composition for forming an anti-reflective layer on a photoresist layer, said composition comprising at least one salt of claim 1 and water.

21. An article of manufacture comprising a substrate, a photoresist layer deposited on top of said substrate and a layer of anti-reflective material deposited on top of said photoresist layer, wherein said layer of anti-reflective material contains at least one salt of claim 5.

* * * * *